(12) United States Patent
Liu et al.

(10) Patent No.: US 11,215,679 B2
(45) Date of Patent: Jan. 4, 2022

(54) METHOD AND APPARATUS FOR DETECTING MICRO SHORT CIRCUIT OF BATTERY

(71) Applicant: HUAWEI TECHNOLOGIES CO., LTD., Guangdong (CN)

(72) Inventors: Bingxiao Liu, Shanghai (CN); Guanghui Zhang, Dongguan (CN); Yuejiu Zheng, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 97 days.

(21) Appl. No.: 16/365,352

(22) Filed: Mar. 26, 2019

(65) Prior Publication Data
US 2019/0219640 A1    Jul. 18, 2019

Related U.S. Application Data

(63) Continuation of application No. PCT/CN2017/092667, filed on Jul. 12, 2017.

(30) Foreign Application Priority Data

Sep. 27, 2016    (CN) .......................... 201610854888.4

(51) Int. Cl.
*G01R 31/52* (2020.01)
*G01R 31/36* (2020.01)
(Continued)

(52) U.S. Cl.
CPC ............ *G01R 31/52* (2020.01); *B60L 3/0046* (2013.01); *G01R 19/16542* (2013.01);
(Continued)

(58) Field of Classification Search
CPC . B60L 3/0046; G01R 19/16542; G01R 31/36; G01R 31/3842; G01R 31/387;
(Continued)

(56) References Cited

U.S. PATENT DOCUMENTS 5,945,805 A      8/1999   Takei et al.
8,049,465 B2 *  11/2011   Barsoukov ........... G01R 31/382
                                                        320/132
(Continued)

FOREIGN PATENT DOCUMENTS

CN      1174441 A      2/1998
CN    101622547 A      1/2010
(Continued)

OTHER PUBLICATIONS

Guo Hong-xia et al., Fast determination of micro short circuit in sintered MH-Ni battery. Chinese Journal of Power Sources, vol. 34, No. 6, Jun. 2010, 2 pages.

*Primary Examiner* — Vinh P Nguyen
(74) *Attorney, Agent, or Firm* — Womble Bond Dickinson (US) LLP

(57) ABSTRACT

A method and an apparatus for detecting a micro short circuit of a battery are provided. The detection method includes: obtaining a first reference charge capacity at a first charging end moment and a second reference charge capacity at a second charging end moment of a to-be-detected single battery included in a to-be-detected battery pack (S201), where the reference charge capacity is a difference between an electric quantity of the to-be-detected single battery and an electric quantity of a reference single battery, and the reference single battery is a single battery, which has a largest voltage value at a charging end moment, in all single batteries included in the to-be-detected battery pack; and determining, based on a difference between the first reference charge capacity and the second reference charge capacity, that a micro short circuit occurs in the to-be-detected single battery.

20 Claims, 3 Drawing Sheets

Obtain a first reference charge capacity at a first charging end moment and a second reference charge capacity at a second charging end moment of a to-be-detected single battery included in a to-be-detected battery pack  — S201

Determine, based on a difference between the first reference charge capacity and the second reference charge capacity, that a micro short circuit occurs in the to-be-detected single battery  — S202

(51) Int. Cl.
   *G01R 31/387* (2019.01)
   *G01R 31/3842* (2019.01)
   *B60L 3/00* (2019.01)
   *G01R 19/165* (2006.01)
   *H01M 10/42* (2006.01)

(52) U.S. Cl.
   CPC ........... *G01R 31/36* (2013.01); *G01R 31/387* (2019.01); *G01R 31/3842* (2019.01); *H01M 10/425* (2013.01); *H01M 2010/4271* (2013.01)

(58) Field of Classification Search
   CPC ...... G01R 31/50; G01R 31/52; G01R 31/025; H01M 10/425; H01M 2010/4271; H01M 10/4285; H01M 10/482; H01M 10/4228; Y02E 60/10
   See application file for complete search history.

(56) References Cited

U.S. PATENT DOCUMENTS

| | | | |
|---|---|---|---|
| 8,487,629 B2 * | 7/2013 | Seo | H02J 7/0029 324/427 |
| 8,643,332 B2 * | 2/2014 | Yokotani | G01R 19/16542 320/116 |
| 8,749,204 B2 * | 6/2014 | Majima | G01R 31/36 320/149 |
| 9,130,377 B2 * | 9/2015 | Barsukov | H02J 7/0047 |
| 9,880,225 B2 * | 1/2018 | Koba | G01R 31/3648 |
| 10,330,739 B2 * | 6/2019 | Quiambao | G01R 31/392 |
| 10,479,204 B2 * | 11/2019 | Murai | B60L 58/16 |
| 10,788,536 B2 * | 9/2020 | Zhang | G01R 31/367 |
| 11,031,796 B2 * | 6/2021 | Yao | H02M 1/32 |
| 2006/0186859 A1 | 8/2006 | Fujikawa et al. | |
| 2011/0184677 A1 | 7/2011 | Tae et al. | |
| 2011/0187329 A1 | 8/2011 | Majima et al. | |
| 2013/0234672 A1 | 9/2013 | Kubota et al. | |
| 2016/0054389 A1 | 2/2016 | Koba et al. | |

FOREIGN PATENT DOCUMENTS

| | | |
|---|---|---|
| CN | 201623512 U | 11/2010 |
| CN | 101957433 A | 1/2011 |
| CN | 102144171 A | 8/2011 |
| CN | 102282477 A | 12/2011 |
| CN | 103138017 A | 6/2013 |
| CN | 104614630 A | 5/2015 |
| CN | 104614631 A | 5/2015 |
| CN | 104614632 A | 5/2015 |
| CN | 105190330 A | 12/2015 |
| CN | 105807226 A | 7/2016 |
| DE | 69837661 T2 | 12/2007 |
| EP | 0992100 B1 | 4/2007 |
| EP | 2428809 A2 | 3/2012 |
| JP | 11-118891 A | 4/1999 |
| JP | 2006-258797 A | 9/2006 |
| JP | 5652802 B2 | 9/2009 |
| JP | 2014-002009 A | 1/2014 |
| JP | 5768769 B2 | 1/2014 |
| JP | 2016-075567 A | 5/2016 |
| JP | 2016-090399 A | 5/2016 |

* cited by examiner

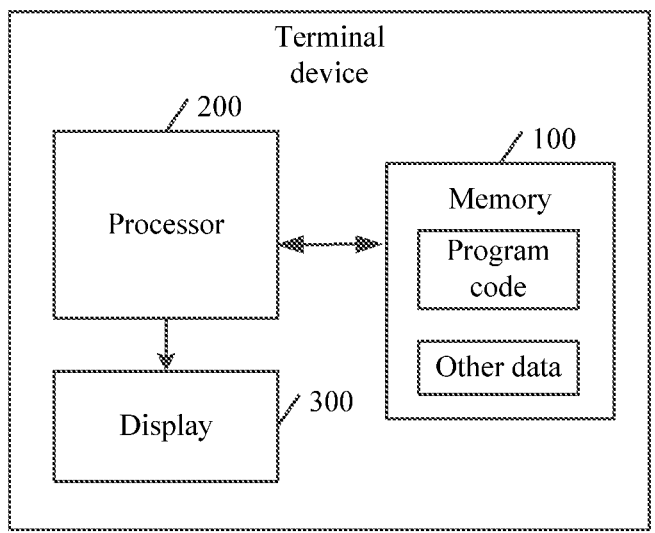

FIG. 1

Obtain a first reference charge capacity at a first charging end moment and a second reference charge capacity at a second charging end moment of a to-be-detected single battery included in a to-be-detected battery pack — S201

Determine, based on a difference between the first reference charge capacity and the second reference charge capacity, that a micro short circuit occurs in the to-be-detected single battery — S202

FIG. 2

METHOD AND APPARATUS FOR DETECTING MICRO SHORT CIRCUIT OF BATTERY

CROSS-REFERENCE TO RELATED APPLICATIONS

This application is a continuation of International Application No. PCT/CN2017/092667, filed on Jul. 12, 2017, which claims priority to Chinese Patent Application 201610854888.4, filed on Sep. 27, 2016, both of which are hereby incorporated by reference in their entireties.

TECHNICAL FIELD

The present invention relates to the field of battery management, and in particular, to a method and an apparatus for detecting a micro short circuit of a battery for Electric Vehicle.

BACKGROUND

A secondary battery is also referred to as a rechargeable battery or a storage battery. When being used, the secondary battery is affected by factors such as a battery raw material or a battery use manner, and may have safety problems such as a thermal runaway, over-charge, or over-discharge. The thermal runaway is an ultimate representation form of the battery safety problems, and one of main causes for the thermal runaway is a micro short circuit of a battery. The micro short circuit of the battery mainly includes a micro short circuit caused by an external factor, a micro short circuit caused by a change in an internal structure of the battery, and the like. The micro short circuit caused by the change in the internal structure of the battery undergoes a very long evolution process. A phenomenon of a micro short circuit of a battery at an early stage is not significant, and the micro short circuit of the battery is easily diagnosed as problems such as loose connection of a battery bolt, and is difficult to identify. A phenomenon of a micro short circuit occurring in a single battery included in a battery pack including a plurality of single batteries is contingent, which increases difficulty in identifying, from the battery pack, a single battery having a micro short circuit. However, the micro short circuit of the battery may cause severe safety problems such as a battery thermal runaway in a later period. The micro short circuit of the battery is one of battery security problems that urgently need to be resolved.

In the prior art, a terminal voltage $U_i$ and an output current I of each single battery included in a secondary battery pack are collected, equivalent internal resistance $Z_i$ of each single battery is calculated, and whether a micro short circuit occurs in the single battery is determined by using a difference $\Delta Z_i$ between $Z_i$ and reference resistance. The reference resistance is an average value of equivalent internal resistance of all single batteries in the battery pack. If a relatively large quantity of single batteries are connected in series in the battery pack, when the equivalent internal resistance of each single battery is calculated in real time by using a manner of detecting a micro short circuit in the prior art, a calculation amount is large, a hardware requirement on a battery management system (BMS) and implementation complexity are high. Moreover, as the battery pack ages, inconsistency between the single batteries in the battery pack is increasing. When $\Delta Z_i$ is used to determine a micro short circuit of a battery, it is likely to determine the inconsistency between the batteries as the micro short circuit, and it is likely to falsely report an internal resistance change caused by a contact resistance fault and the like, as the micro short circuit, resulting in a high misjudgment rate and low applicability.

SUMMARY

Embodiments of the present invention provide a method and an apparatus for detecting a micro short circuit of a battery, which can improve accuracy in detecting a micro short circuit of a battery, enhance applicability of detecting a micro short circuit of a battery, and decrease a battery fault misjudgment rate.

According to a first aspect, a method for detecting a micro short circuit of a battery is provided, and may include:

obtaining a first reference charge capacity at a first charging end moment and a second reference charge capacity at a second charging end moment of a to-be-detected single battery included in a to-be-detected battery pack, where the reference charge capacity is a difference between an electric quantity of the to-be-detected single battery and an electric quantity of a reference single battery, and the reference single battery is a single battery, which has a largest voltage value at a charging end moment, in all single batteries included in the to-be-detected battery pack; and determining, based on a difference between the first reference charge capacity and the second reference charge capacity, that a micro short circuit occurs in the to-be-detected single battery. The difference between the first reference charge capacity and the second reference charge capacity includes a direct difference between the first reference charge capacity and the second reference charge capacity, and also includes a difference of another quantity calculated based on the first reference charge capacity and the second reference charge capacity. The micro short circuit includes a tiny short circuit that occurs inside a single battery or between positive and negative battery terminals.

Calculation of the reference charge capacity of the single battery used in this embodiment of the present invention is related to a difference of electric quantities between the reference single battery and the to-be-detected single battery at a charging end moment, and a difference between charging electric quantities of single batteries is considered, so that detection on a short circuit status of a battery is more accurate and a detection accuracy rate is higher. In this embodiment of the present invention, a difference between reference charge capacities is used to determine a short circuit status of a battery. Even a tiny sign of a short circuit inside a battery can be detected based on an electric quantity difference between single batteries, so that a micro short circuit status of a single battery can be monitored starting from a tiny short circuit, thereby improving accuracy in detecting a short circuit inside a battery and decreasing a battery fault misjudgment rate. Monitoring on a short circuit of a battery can be started from an early stage, thereby better preventing risks, such as a thermal runaway, caused by a micro short circuit of a single battery.

In one embodiment, the determining, based on a difference between the first reference charge capacity and the second reference charge capacity, that a micro short circuit occurs in the to-be-detected single battery includes:

calculating the difference between the second reference charge capacity and the first reference charge capacity, and calculating a time length between the second charging end moment and the first charging end moment; determining a ratio of the difference between the second reference charge capacity and the first reference charge capacity to the time length as a leakage current value of the to-be-detected single battery; and if the leakage current value is greater than or equal to a preset current threshold, determining that a micro short circuit occurs in the to-be-detected single battery.

In one embodiment, after the reference charge capacity of the to-be-detected single battery is obtained, the leakage current value of the to-be-detected single battery may be further calculated. The micro short circuit status of the to-be-detected single battery is more visually and clearly determined by using the leakage current value, so that the determining is more accurate, and applicability is higher.

In one embodiment, the determining, based on a difference between the first reference charge capacity and the second reference charge capacity, that a micro short circuit occurs in the to-be-detected single battery includes:

calculating the difference between the second reference charge capacity and the first reference charge capacity, and calculating a time length between the second charging end moment and the first charging end moment; determining a ratio of the difference between the second reference charge capacity and the first reference charge capacity to the time length as a leakage current value of the to-be-detected single battery; calculating an average voltage value, over the time length, of each single battery in the to-be-detected battery pack, and determining micro short circuit resistance of the to-be-detected single battery based on the leakage current value; and if the micro short circuit resistance is less than a preset resistance threshold, determining that a micro short circuit occurs in the to-be-detected single battery.

In one embodiment, after the leakage current value of the to-be-detected single battery is obtained, the micro short circuit resistance of the to-be-detected single battery may be further calculated. The micro short circuit status of the to-be-detected single battery is more visually and clearly determined by using the micro short circuit resistance, so that diversity of manners of detecting a micro short circuit of a battery is increased, and flexibility is high. Calculation of the micro short circuit resistance may also be used to quantitatively detect the micro short circuit resistance of the to-be-detected single battery, so that the determining is more accurate, a battery fault misjudgment rate is decreased, and applicability is higher.

In one embodiment, the obtaining a first reference charge capacity at a first charging end moment and a second reference charge capacity at a second charging end moment of a to-be-detected single battery included in a to-be-detected battery pack includes:

determining a first remaining charging time of the to-be-detected single battery at the first charging end moment and a second remaining charging time of the to-be-detected single battery at the second charging end moment; and calculating, based on a charging current of the to-be-detected single battery, the first reference charge capacity corresponding to the first remaining charging time and the second reference charge capacity corresponding to the second remaining charging time, where the first remaining charging time is required charging duration corresponding to a voltage difference between the to-be-detected single battery and the reference single battery at the first charging end moment; and the second remaining charging time is required charging duration corresponding to a voltage difference between the to-be-detected single battery and the reference single battery at the second charging end moment.

In one embodiment, a remaining charging time of the to-be-detected single battery is calculated, and the reference charge capacity of the to-be-detected single battery is calculated by using the remaining charging time, so that calculation of the reference charge capacity is more closely associated with a charging status of a battery, and accuracy in determining a micro short circuit of a battery is higher.

In one embodiment, the determining a first remaining charging time of the to-be-detected single battery at the first charging end moment and a second remaining charging time of the to-be-detected single battery at the second charging end moment includes:

obtaining a voltage value of each single battery in the to-be-detected battery pack at the first charging end moment, and determining a first reference single battery in the to-be-detected battery pack; searching, on a first charging voltage curve of the first reference single battery, for a first moment corresponding to a first voltage value, where the first voltage value is a voltage value of the to-be-detected single battery at the first charging end moment; using a time difference $\Delta t_0$ between the first moment and the first charging end moment as the first remaining charging time; obtaining a voltage value of each single battery in the to-be-detected battery pack at the second charging end moment, and determining a second reference single battery in the to-be-detected battery pack; searching, on a second charging voltage curve of the second reference single battery, for a second moment corresponding to a second voltage value, where the second voltage value is a voltage value of the to-be-detected single battery at the second charging end moment; and using a time difference $\Delta t_1$ between the second moment and the second charging end moment as the second remaining charging time.

In one embodiment, the reference single battery can be determined by using the voltage value of each single battery in the to-be-detected battery pack, a charging voltage curve of the reference single battery is recorded, and further, the remaining charging time of the to-be-detected single battery can be determined by using the voltage difference. Determining of the remaining charging time of the to-be-detected single battery is more closely associated with a charging electric quantity status of each single battery in the to-be-detected battery pack, thereby improving calculation validity of the reference charge capacity of the to-be-detected single battery, and improving accuracy in determining a micro short circuit of a battery.

In one embodiment, the calculating, based on a charging current of the to-be-detected single battery, the first reference charge capacity corresponding to the first remaining charging time and the second reference charge capacity corresponding to the second remaining charging time includes:

calculating an integral of the charging current of the to-be-detected single battery in $\Delta t_0$ to obtain a first integral value, and scaling up/down the first integral value based on a preset battery capacity ratio to obtain the first reference charge capacity; and calculating an integral of the charging current of the to-be-detected single battery in $\Delta t_1$ to obtain a second integral value, and scaling up/down the second integral value based on the preset battery capacity ratio to obtain the second reference charge capacity.

In one embodiment, the reference charge capacity of the to-be-detected single battery is calculated by using the integral, and a change amplitude of the reference charge capacity can be further controlled by using the preset battery capacity ratio, to adapt to error control of the reference charge capacity, thereby enhancing applicability of determining a micro short circuit status of a battery by using the reference charge capacity, and decreasing a misjudgment rate of a battery micro short circuit status.

In one embodiment, the calculating an average voltage value, over the time length, of each single battery in the to-be-detected battery pack includes:

collecting a voltage value of each single battery in the to-be-detected battery pack at each of N voltage sampling moments between the second charging end moment and the first charging end moment, where duration between two adjacent voltage sampling moments of the N voltage sampling moments is less than or equal to a preset voltage sampling period, and N is an integer greater than or equal to 2; sequentially calculating a first average voltage value of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment; scaling up/down the first average voltage value and the second average voltage value based on a preset filtering coefficient, and adding up a scaled value of the first average voltage value and a scaled value of the second average voltage value to obtain an average voltage value at the $K^{th}$ voltage sampling moment; and when K is equal to N, determining the average voltage value at the $K^{th}$ voltage sampling moment as the average voltage value over the time length.

In one embodiment, an average voltage value, over a time length between two charging end moments, of a voltage value of each single battery in the to-be-detected battery pack is calculated, and the micro short circuit resistance of the to-be-detected single battery is calculated by using the average voltage value, so that accuracy is higher, and applicability of detecting a micro short circuit of a battery is improved.

In one embodiment, the to-be-detected single battery is any one of at least one single battery in the to-be-detected battery pack; and after the determining a ratio of the difference between the second reference charge capacity and the first reference charge capacity to the time length as a leakage current value of the to-be-detected single battery, the method further includes:

calculating a leakage current value of another single battery included in the to-be-detected battery pack, and calculating a first average value of a leakage current value of all of the at least one single battery; and determining, based on the first average value, that a leakage current value of a target single battery of the at least one single battery needs to be corrected, where the leakage current value of the target single battery is less than a first preset current threshold.

In one embodiment, whether to correct the leakage current value of the target single battery in the to-be-detected battery pack is determined by calculating an average value of the leakage current values of the single batteries in the to-be-detected battery pack. This can prevent an abnormal single battery in the to-be-detected battery pack from affecting another single battery, and decrease a misjudgment rate of a micro short circuit of a battery, and applicability is higher.

In one embodiment, after the determining, based on the first average value, that a leakage current value of a target single battery of the at least one single battery needs to be corrected, the method further includes:

if the first average value is less than a second preset current threshold, obtaining a leakage current value of at least one target single battery of the at least one single battery; and calculating a second average value of the leakage current value of the at least one target single battery, and adjusting a leakage current value of each target single battery based on the second average value to obtain a corrected leakage current value of each target single battery.

In one embodiment, a leakage current value of an abnormal to-be-detected single battery in the to-be-detected battery pack can be corrected, and the micro short circuit status of the to-be-detected single battery is determined by using a corrected leakage current value. This can improve accuracy in determining a micro short circuit status of a single battery, and enhance applicability of detecting a micro short circuit status of a single battery.

In one embodiment, the time length between the second charging end moment and the first charging end moment includes at least one consecutive or non-consecutive battery charging period, where the battery charging period is duration between two adjacent charging end moments of the to-be-detected battery pack.

In one embodiment, during calculation of the reference charge capacity of the to-be-detected single battery, the second charging end moment and the first charging end moment are selected with high flexibility. This can improve flexibility in calculating the reference charge capacity of the to-be-detected single battery, and enhance applicability of detecting a micro short circuit status of a single battery.

In one embodiment, a value of the preset battery capacity ratio is greater than 0.9 and less than 1.1.

In one embodiment, an estimate of a leakage current value or micro short circuit resistance of the single battery can be controlled, by using the value of the preset battery capacity ratio, within a preset error range, and an estimation accuracy rate of the micro short circuit resistance of the single battery can be set within an acceptable range, thereby improving applicability of the method for detecting a micro short circuit of a battery provided in this embodiment of the present invention.

According to a second aspect, an apparatus for detecting a micro short circuit of a battery is provided, and may include:

an obtaining module, configured to obtain a first reference charge capacity at a first charging end moment and a second reference charge capacity at a second charging end moment of a to-be-detected single battery included in a to-be-detected battery pack, where the reference charge capacity is a difference between an electric quantity of the to-be-detected single battery and an electric quantity of a reference single battery, and the reference single battery is a single battery, which has a largest voltage value at a charging end moment, in all single batteries included in the to-be-detected battery pack; and a determining module, configured to determine, based on a difference that is obtained by the obtaining module and that is between the first reference charge capacity and the second reference charge capacity, that a micro short circuit occurs in the to-be-detected single battery.

In one embodiment, the determining module is configured to:

use the obtaining module to: calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery; and if the leakage current value is greater than or equal to a preset current threshold, determine that a micro short circuit occurs in the to-be-detected single battery.

In one embodiment, the determining module is configured to:

use the obtaining module to: calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery;

use the obtaining module to: calculate an average voltage value, over the time length, of each single battery in the to-be-detected battery pack, and determine micro short circuit resistance of the to-be-detected single battery based on the leakage current value; and if the micro short circuit resistance is less than a preset resistance threshold, determine that a micro short circuit occurs in the to-be-detected single battery.

In one embodiment, the determining module is further configured to:

determine a first remaining charging time of the to-be-detected single battery at the first charging end moment and a second remaining charging time of the to-be-detected single battery at the second charging end moment; and the obtaining module is configured to:

calculate, based on a charging current of the to-be-detected single battery, the first reference charge capacity corresponding to the first remaining charging time determined by the determining module and the second reference charge capacity corresponding to the second remaining charging time determined by the determining module, where the first remaining charging time is required charging duration corresponding to a voltage difference between the to-be-detected single battery and the reference single battery at the first charging end moment; and the second remaining charging time is required charging duration corresponding to a voltage difference between the to-be-detected single battery and the reference single battery at the second charging end moment.

In one embodiment, the determining module is configured to:

obtain a voltage value of each single battery in the to-be-detected battery pack at the first charging end moment, and determine a first reference single battery in the to-be-detected battery pack; search, on a first charging voltage curve of the first reference single battery, for a first moment corresponding to a first voltage value, where the first voltage value is a voltage value of the to-be-detected single battery at the first charging end moment; and use a time difference $\Delta t_0$ between the first moment and the first charging end moment as the first remaining charging time; and obtain a voltage value of each single battery in the to-be-detected battery pack at the second charging end moment, and determine a second reference single battery in the to-be-detected battery pack; search, on a second charging voltage curve of the second reference single battery, for a second moment corresponding to a second voltage value, where the second voltage value is a voltage value of the to-be-detected single battery at the second charging end moment; and use a time difference $\Delta t_1$ between the second moment and the second charging end moment as the second remaining charging time.

In one embodiment, the obtaining module is configured to:

calculate an integral of the charging current of the to-be-detected single battery in $\Delta t_0$ to obtain a first integral value, and scale up/down the first integral value based on a preset battery capacity ratio to obtain a first reference charge capacity; and calculate an integral of the charging current of the to-be-detected single battery in $\Delta t_1$ to obtain a second integral value, and scale up/down the second integral value based on the preset battery capacity ratio to obtain the second reference charge capacity.

In one embodiment, the detection apparatus further includes:

a collection module, configured to collect a voltage value of each single battery in the to-be-detected battery pack at each of N voltage sampling moments between the second charging end moment and the first charging end moment, where duration between two adjacent voltage sampling moments of the N voltage sampling moments is less than or equal to a preset voltage sampling period, and N is an integer greater than or equal to 2; and the obtaining module is specifically configured to:

sequentially calculate a first average voltage value of a voltage value, collected by the collection module, of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment;

scale up/down the first average voltage value and the second average voltage value based on a preset filtering coefficient, and add up a scaled value of the first average voltage value and a scaled value of the second average voltage value to obtain an average voltage value at the $K^{th}$ voltage sampling moment; and when K is equal to N, determine the average voltage value at the $K^{th}$ voltage sampling moment as the average voltage value over the time length.

In one embodiment, the to-be-detected single battery is any one of at least one single battery in the to-be-detected battery pack;

the obtaining module is further configured to:

calculate a leakage current value of another single battery included in the to-be-detected battery pack, and calculate a first average value of a leakage current value of all of the at least one single battery; and the determining module is further configured to:

determine, based on the first average value calculated by the obtaining module, that a leakage current value of a target single battery of the at least one single battery needs to be corrected, where the leakage current value of the target single battery is less than a first preset current threshold.

In one embodiment, the detection apparatus further includes:

a correction module, configured to: when the first average value calculated by the obtaining module is less than a second preset current threshold, obtain a leakage current value of at least one target single battery of the at least one single battery; and use the obtaining module to: calculate a second average value of the leakage current value of the at least one target single battery, and adjust a leakage current value of each target single battery based on the second average value to obtain a corrected leakage current value of each target single battery.

In one embodiment, the time length between the second charging end moment and the first charging end moment includes at least one consecutive or non-consecutive battery charging period, where the battery charging period is duration between two adjacent charging end moments of the to-be-detected battery pack.

According to a third aspect, an embodiment of the present invention provides a terminal device, including a memory and a processor.

The memory is configured to store a group of program code.

The processor is configured to invoke the program code stored in the memory, to perform the following operations:

obtaining a first reference charge capacity at a first charging end moment and a second reference charge capacity at a second charging end moment of a to-be-detected single battery included in a to-be-detected battery pack, where the reference charge capacity is a difference between an electric quantity of the to-be-detected single battery and an electric quantity of a reference single battery, and the reference single battery is a single battery, which has a largest voltage value at a charging end moment, in all single batteries included in the to-be-detected battery pack; and determining, based on a difference between the first reference charge capacity and the second reference charge capacity, that a micro short circuit occurs in the to-be-detected single battery.

In one embodiment, the processor is configured to:

calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery; and if the leakage current value is greater than or equal to a preset current threshold, determine that a micro short circuit occurs in the to-be-detected single battery.

In one embodiment, the processor is configured to:

calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery;

calculate an average voltage value, over the time length, of each single battery in the to-be-detected battery pack, and determine micro short circuit resistance of the to-be-detected single battery based on the leakage current value; and if the micro short circuit resistance is less than a preset resistance threshold, determine that a micro short circuit occurs in the to-be-detected single battery.

In one embodiment, the processor is configured to:

determine a first remaining charging time of the to-be-detected single battery at the first charging end moment and a second remaining charging time of the to-be-detected single battery at the second charging end moment;

calculate, based on a charging current of the to-be-detected single battery, the first reference charge capacity corresponding to the first remaining charging time and the second reference charge capacity corresponding to the second remaining charging time, where the first remaining charging time is required charging duration corresponding to a voltage difference between the to-be-detected single battery and the reference single battery at the first charging end moment; and the second remaining charging time is required charging duration corresponding to a voltage difference between the to-be-detected single battery and the reference single battery at the second charging end moment.

In one embodiment, the processor is configured to:

obtain a voltage value of each single battery in the to-be-detected battery pack at the first charging end moment, and determine a first reference single battery in the to-be-detected battery pack; search, on a first charging voltage curve of the first reference single battery, for a first moment corresponding to a first voltage value, where the first voltage value is a voltage value of the to-be-detected single battery at the first charging end moment; and use a time difference $\Delta t_0$ between the first moment and the first charging end moment as the first remaining charging time; and obtain a voltage value of each single battery in the to-be-detected battery pack at the second charging end moment, and determine a second reference single battery in the to-be-detected battery pack; search, on a second charging voltage curve of the second reference single battery, for a second moment corresponding to a second voltage value, where the second voltage value is a voltage value of the to-be-detected single battery at the second charging end moment; and use a time difference $\Delta t_1$ between the second moment and the second charging end moment as the second remaining charging time.

In one embodiment, the processor is configured to:

calculate an integral of the charging current of the to-be-detected single battery in $\Delta t_0$ to obtain a first integral value, and scale up/down the first integral value based on a preset battery capacity ratio to obtain a first reference charge capacity; and calculate an integral of the charging current of the to-be-detected single battery in $\Delta t_1$ to obtain a second integral value, and scale up/down the second integral value based on the preset battery capacity ratio to obtain the second reference charge capacity.

In one embodiment, the processor is configured to:

collect a voltage value of each single battery in the to-be-detected battery pack at each of N voltage sampling moments between the second charging end moment and the first charging end moment, where duration between two adjacent voltage sampling moments of the N voltage sampling moments is less than or equal to a preset voltage sampling period, and N is an integer greater than or equal to 2;

sequentially calculate a first average voltage value of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment;

scale up/down the first average voltage value and the second average voltage value based on a preset filtering coefficient, and add up a scaled value of the first average voltage value and a scaled value of the second average voltage value to obtain an average voltage value at the $K^{th}$ voltage sampling moment; and when K is equal to N, determine the average voltage value at the $K^{th}$ voltage sampling moment as the average voltage value over the time length.

In one embodiment, the to-be-detected single battery is any one of at least one single battery in the to-be-detected battery pack.

The processor is further configured to:

calculate a leakage current value of another single battery included in the to-be-detected battery pack, and calculate a first average value of a leakage current value of all of the at least one single battery; and determine, based on the first average value, that a leakage current value of a target single battery of the at least one single battery needs to be corrected, where the leakage current value of the target single battery is less than a first preset current threshold.

In one embodiment, the processor is further configured to:

if the first average value is less than a second preset current threshold, obtain a leakage current value of at least one target single battery of the at least one single battery; and calculate a second average value of the leakage current value of the at least one target single battery, and adjust a leakage current value of each target single battery based on the second average value to obtain a corrected leakage current value of each target single battery.

In one embodiment, the time length between the second charging end moment and the first charging end moment includes at least one consecutive or non-consecutive battery charging period, where the battery charging period is duration between two adjacent charging end moments of the to-be-detected battery pack.

Calculation of the reference charge capacity of the single battery used in the embodiments of the present invention is related to a difference of electric quantities between the reference single battery and the to-be-detected single battery at a charging end moment, and a difference between charging electric quantities of single batteries is considered, so that detection on a short circuit status of a battery is more thorough and a detection accuracy rate is higher. In the embodiments of the present invention, a difference between reference charge capacities is used to determine a short circuit status of a battery. Even a tiny sign of a short circuit inside a battery can be detected based on an electric quantity difference between single batteries, so that a micro short circuit status of a single battery can be monitored starting from a tiny short circuit. Monitoring on a short circuit of a battery can be started from an early stage, thereby better preventing risks, such as a thermal runaway, caused by a micro short circuit of a single battery. Further, in the embodiments of the present invention, the micro short circuit resistance of each single battery can be estimated based on the leakage current value of the single battery, a tiny short circuit of a single battery can be detected in advance, and a quantitative result can be provided. This can improve accuracy in detecting a micro short circuit, and decrease a battery fault misjudgment rate, to achieve an objective of prevention, and ensure operation safety of a battery pack.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 1 is a schematic structural diagram of a terminal device according to an embodiment of the present invention;

FIG. 2 is a schematic flowchart of a method for detecting a micro short circuit of a battery according to an embodiment of the present invention;

DESCRIPTION OF EMBODIMENTS

Figure 3:
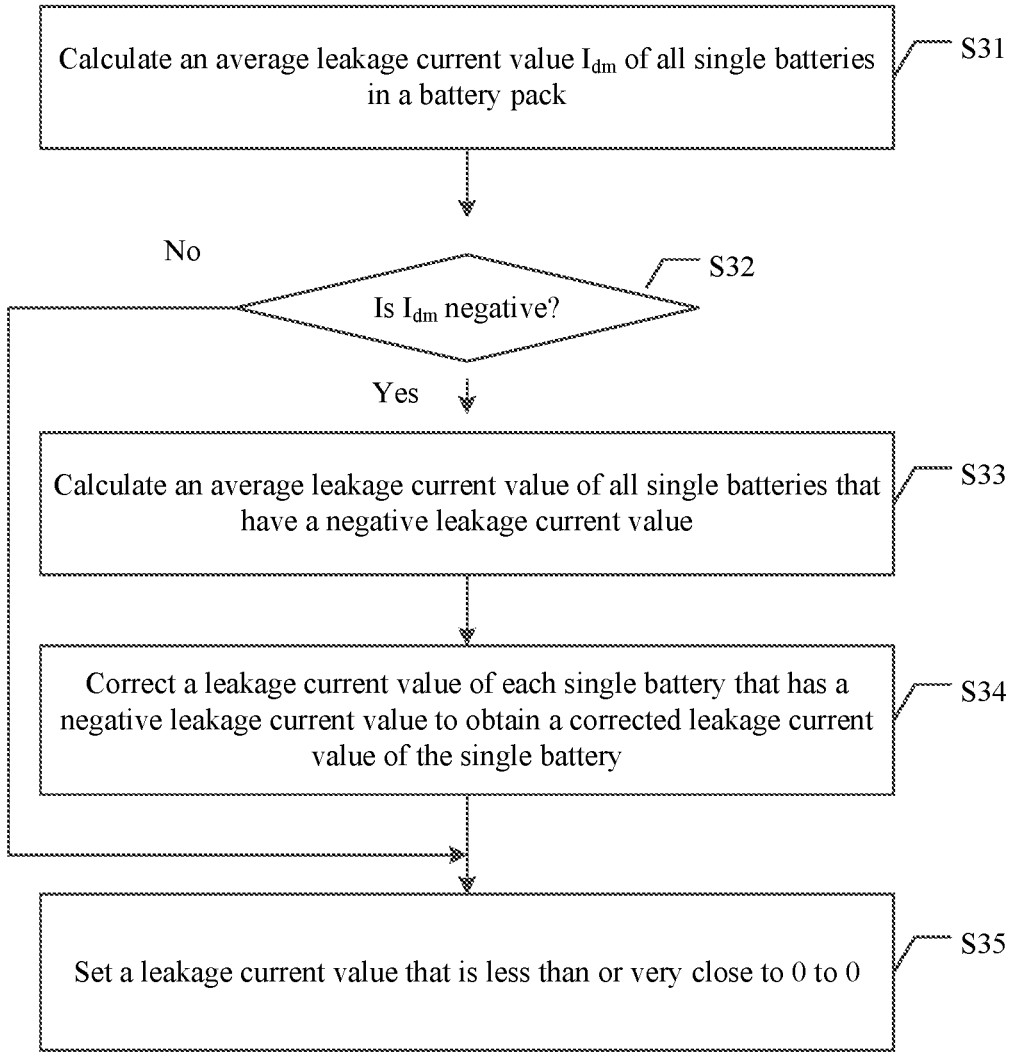
FIG. 3 is another schematic flowchart of a method for detecting a micro short circuit of a battery according to an embodiment of the present invention.

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

In specific implementation, a method for detecting a micro short circuit of a battery may be applied to a terminal device. The terminal device may be built in an existing BMS, or may be a device that includes an existing BMS. This may be determined according to a requirement of an actual application scenario, and is not limited herein. The terminal device may also be referred to as user equipment (UE), a mobile station (MS), a mobile terminal, or the like. The terminal device may alternatively be a portable mobile apparatus, a pocket-sized mobile apparatus, a handheld mobile apparatus, a computer built-in mobile apparatus, an in-vehicle mobile apparatus, or the like. For example, the terminal device may be a mobile phone (also referred to as a "cellular" phone), a computer with mobility, an electric automobile, or the like. It should be understood that, in addition to the terminal device, the method for detecting a micro short circuit of a battery provided in the embodiments of the present invention may be applied to another apparatus that uses a secondary battery. No limitation is imposed herein.

Referring to FIG. 1, FIG. 1 is a schematic structural diagram of a terminal device according to an embodiment of the present invention. As shown in FIG. 1, the terminal device may include: a memory 100, a processor 200, a display 300, and the like. The memory 100 stores a group of program code. The program code is used to implement operations such as recognition of a charging status, estimation of an electric quantity of a battery, calculation of a reference charge capacity, recording of a charging time, and calculation of micro short circuit resistance of a battery. The processor 200 is configured to read the program code in the memory 100, and then perform a method defined by the program code. For example, the processor 200 may read the program code stored in the memory 100 to perform operations such as detecting a micro short circuit of a single battery in a battery pack.

The processor 200 may include one or more processors, for example, the processor 200 may include one or more central processing units. When the processor 200 includes a plurality of processors, the plurality of processors may be integrated into a same chip, or may be independent chips, respectively. A processor may include one or more processing cores. The following embodiments use a multi-core processor as an example. However, the method for detecting a micro short circuit of a battery provided in the embodiments of the present invention may also be applied to a single-core processor. The processor may be specifically determined according to a requirement of an actual application scenario. No limitation is imposed herein.

In addition, the memory 100 may further store other data different from the program code. The other data may include data generated after the processor executes the program code, for example, a voltage value during charging of a single battery. The memory 100 generally includes an internal memory and an external storage. The internal memory may be a random access memory (RAM), a read-only memory (ROM), a cache, or the like. The external storage may be a hard disk, an optical disc, a universal serial bus (USB) flash drive, a floppy disk, a tape drive, or the like. The program code is generally stored in the external storage. Before performing processing, the processor may load the program code from the external storage to the internal memory.

In specific implementation, the method for detecting a micro short circuit of a battery provided in the embodiments of the present invention may be applied to a battery pack including a plurality of single batteries, to detect a single battery that is in the battery pack and in which a micro short circuit occurs. A to-be-detected single battery provided in the embodiments of the present invention may be any battery in the battery pack. A reference charge capacity ($C_{RC}$ for short) of the to-be-detected single battery provided in the embodiments of the present invention is a difference between an electric quantity of the to-be-detected single battery and an electric quantity of a reference single battery in the battery pack when changing of the battery pack ends (namely, a charging end moment), where the reference single battery is a single battery that has a largest voltage value when changing of the battery pack ends.

It should be noted that the charging end moment may be a moment at which the battery pack is fully charged, or may be a moment at which a user forcibly cuts off power to stop charging the battery pack. The moment at which the battery pack is fully charged may be specifically a moment at which any single battery in the battery pack is fully charged. The reference single battery may be a single battery that is earliest fully charged in the battery pack, or may be a single battery that has a largest voltage value (or a largest electric quantity) when charging of the battery pack is forcibly stopped. For example, when charging of the battery pack ends, a charging status of a single battery 1 in the battery pack reaches 100%. In this case, the battery 1 has a largest voltage value V1. The to-be-detected single battery is a single battery 2, and a charging status of the single battery 2 is 95%. In this case, a voltage value of the single battery 2 is V2, and V2 is less than V1. Therefore, it can be learned that $C_{RC}$ of the single battery 2 is (V1−V2), and corresponds to a 5% charging electric quantity.

Referring to FIG. 2, FIG. 2 is a schematic flowchart of a method for detecting a micro short circuit of a battery according to an embodiment of the present invention. The method provided in this embodiment of the present invention includes the following operations.

Operation S201: Obtain a first reference charge capacity at a first charging end moment and a second reference charge capacity at a second charging end moment of a to-be-detected single battery included in a to-be-detected battery pack.

In one embodiment, a terminal device (briefly referred to as a terminal in the following) may collect, by using an existing BMS, charging data obtained when a battery system is operating normally, and further may search, based on the charging data collected by the BMS, for a single battery that is in the battery pack and in which a micro short circuit occurs. The charging data may include: a charging end moment of the battery pack, a charging electric quantity of each single battery in the battery pack, a voltage value of each single battery in the battery pack, and the like. The charging data is merely an example rather than an exhaustive list, and includes but is not limited to the foregoing data. The data may be specifically determined according to an actual requirement. No limitation is imposed herein.

In one embodiment, in a process of charging the battery pack, the BMS may perform real-time detection and determining on a voltage value of each single battery in the battery pack, and may further record a charging voltage curve of each single battery in the charging process. When a voltage value of any single battery in the battery pack is equal to a preset fully charged voltage value, the BMS may cut off a charging power supply to stop charging the battery pack. This moment is a full charging moment (namely, the charging end moment) of the battery pack. The BMS may record the full charging moment of the battery pack as the charging end moment of the battery pack. In addition, the BMS performs real-time detection on the voltage value of each single battery in the process of charging the battery pack, and if a power-off signal is detected when the preset fully charged voltage value is not yet detected, a power-off moment may be recorded as the charging end moment of the battery pack. The terminal may select, from the single batteries based on a voltage value, recorded by the BMS, of each single battery at the charging end moment, a single battery that has a largest voltage value as a reference single battery of another single battery, and further may obtain a charging voltage curve (set as a charging voltage curve 1) of the single battery that has the largest voltage value. After obtaining the charging voltage curve 1, the terminal may interpolate voltage values of other single batteries at the charging end moment to the charging voltage curve 1, to obtain charging moments, on the charging voltage curve 1, corresponding to the voltage values of the other single batteries, and further may calculate a remaining charging time of each of other single batteries.

It should be noted that, when recording the charging voltage curve of each single battery, the BMS may record a complete charging voltage curve of each single battery in a whole charging process, or may record a part of the charging voltage curve in a specific time phase in the charging process, which has high flexibility. In specific implementation, that the BMS records a complete charging voltage curve of a single battery in a whole charging process is simple to operate, requires support of relatively much memory, and has a relatively high requirement on hardware of the terminal. That the BMS records a part of the charging voltage curve of a single battery may save memory, and implement low costs and high applicability. A part of a charging voltage curve may be specifically a later-period charging voltage curve of a whole charging process of a single battery. The later period may be specifically a time segment that has a preset time length from the charging end moment. The specific preset time length may be set based on factors such as a hardware configuration condition of the BMS and micro short circuit resistance of a battery in an actual application scenario. No limitation is imposed herein. A part of a charging voltage curve may be, for example, a charging voltage curve of 10 minutes before the charging end moment (that is, a charging voltage curve corresponding to a time length of 10 minutes), or a charging voltage curve of 30 minutes before the charging end moment.

In one embodiment, a remaining charging time of the to-be-detected single battery may be required charging duration corresponding to a voltage difference between the to-be-detected single battery and the reference single battery at the charging end moment. In other words, when power is not cut off, the to-be-detected single battery is continuously charged, according to a charging law before the charging end moment, to the fully charged voltage value or the voltage value of the reference single battery, and then the power is cut off; a time length between the power-off moment and the charging end moment is the remaining charging time of the to-be-detected single battery.

In one embodiment, during calculating a remaining charging time of any single battery (set as a to-be-detected single battery, and a single battery 2 in a battery pack is used as an example) in the battery pack in a charging process (assumed to be $i^{th}$ charging), the terminal may determine, based on the voltage value of each single battery recorded in the BMS, a single battery (which is set as a first reference single battery and assumed to be a single battery 1 in the battery pack) that has a largest voltage value at a current charging end moment (the moment is set as a first charging end moment, and t0 is used as an example), and the voltage value (the voltage value is set as a first voltage value, and Vc1 is used as an example) of the to-be-detected single battery. Further, a charging voltage curve (assumed to be a charging voltage curve 2) of the first reference single battery may be further obtained, and a charging moment (the moment is set as a first moment, and t1 is used as an example) corresponding to Vc1 is searched for on the charging voltage curve 2. After determining t0 and t1, the terminal may calculate the remaining charging time (set as a first remaining charging time) $\Delta t_0$ of the to-be-detected single battery, where $\Delta t_1 = t0 - t1$.

Further, during calculating a remaining charging time of the single battery 2 in the battery pack in another subsequent charging process (assumed to be $(i+1)^{th}$ charging), the terminal may determine, based on the voltage value of each single battery recorded in the BMS, a single battery (which is set as a second reference single battery and assumed to be a single battery 1 in the battery pack. In specific implementation, the second reference single battery may be another single battery, for example, a battery 3. To be specific, the first reference single battery and the second reference single battery may be a same single battery or may be different single batteries, which may be specifically determined based on a charging status of a battery in an actual application scenario. No limitation is imposed herein.) that has a largest voltage value at a current charging end moment (the charging end moment is set as a second charging end moment, and t0' is used as an example), and the voltage value (the voltage value is set as a second voltage value, and Vc2 is used as an example) of the to-be-detected single battery. Further, a charging voltage curve (assumed to be a charging voltage curve 3) of the second reference single battery may be further obtained, and a charging moment (the charging moment is set as a second moment, and t2 is used as an example) corresponding to Vc2 is searched for on the charging voltage curve 3. After determining t0' and t2, the terminal may calculate the remaining charging time (set as a second remaining charging time) $\Delta t_1$ of the to-be-detected single battery, where $\Delta t_1 = t0' - t2$.

It should be noted that, the foregoing $i^{th}$ charging and $(i+1)^{th}$ charging may be two adjacent times of charging, or may be any two times of charging among a plurality of times of charging. In other words, assuming that a time interval between the adjacent two times of charging is a battery charging period, a time interval between the $i^{th}$ charging and the $(i+1)^{th}$ charging may be one battery charging period, or may be a plurality of consecutive battery charging periods or a plurality of non-consecutive battery charging periods. For example, assuming that the battery pack is charged every 24 hours, one battery charging period is 24 hours, the time interval between the $i^{th}$ charging and the $(i+1)^{th}$ charging may be 24 hours, or may be two consecutive battery charging periods (namely, 48 hours), or three consecutive battery charging periods (namely, 72 hours), or two non-consecutive battery charging periods (for example, 48 hours out of 72 hours, and the battery pack may be in an idle state, such as shutdown, during 24 hours therein), or the like. The time interval between the $i^{th}$ charging and the $(i+1)^{th}$ charging may be specifically determined according to a requirement of an actual application scenario. No limitation is imposed herein. In one embodiment, the terminal may preset a quantity of times of recording charging data, which is assumed to be N times, where N is an integer greater than 1. In a process of charging a battery pack, the BMS may record an actual quantity of charging times, which is assumed to be M, where M is less than or equal to N. Each time the battery pack is charged, the BMS increases a value of M by 1. When the actual quantity M of charging times is greater than N, the BMS records only charging data for latest M times, and erases data recorded before the latest M times, to save memory of the BMS.

In one embodiment, after calculating the remaining charging time $\Delta t_0$ of the single battery 2 in the $i^{th}$ charging and the remaining charging time $\Delta t_1$ of the single battery 2 in the $(i+1)^{th}$ charging, the terminal may calculate a reference charge capacity $C_{RC}1$ (namely, a first reference charge capacity) of the single battery 2 in the $i^{th}$ charging and a reference charge capacity $C_{RC}2$ (namely, a second reference charge capacity) of the single battery 2 in the $(i+1)^{th}$ charging. In one embodiment, when calculating $C_{RC}1$, the terminal may calculate an integral of a charging current (namely, a charging current of the to-be-detected single battery), during charging, of the battery pack in $\Delta t_0$ to obtain an integral value (which is set as a first integral value) of the charging current in $\Delta t_0$. An expression is as follows:

where $$C_{RC}1 = k \int_t^{t+\Delta t_0} I$$

$C_{RC}1$ is a reference charge capacity of a current I in $\Delta t_0$, and k is a preset battery capacity ratio.

In one embodiment, for a battery pack including single batteries that are relatively consistent with each other, k may be set to 1 during calculation of $C_{RC}$ of each single battery in the battery pack. In this case, a calculation expression of $C_{RC}$ of each single battery is:

The $$C_{RC} = \int_t^{t+\Delta t_0} I$$

foregoing single batteries that are relatively consistent with each other may be specifically batteries that have similar conditions in various aspects, such as a production material, a battery capacity, or battery power consumption duration. This may be specifically determined based on an actual application scenario, and is not limited herein.

In one embodiment, in consideration of differentiation between single batteries in a battery pack, k may be allowed to be set within a preset error range. Specifically, a value range of k may be set to [0.9,1.1], that is, k may be set to a value greater than or equal to 0.9 and less than or equal to 1.1. To be specific, after calculating the integral value of the charging current of the to-be-detected single battery in $\Delta t_0$, the terminal may scale up/down the integral value based on the preset battery capacity ratio to obtain $C_{RC}1$. k is a scaling ratio of the integral value of the charging current I in $\Delta t_0$. It is assumed that a capacity difference greater than 20% between single batteries is considered as a severe fault of the battery pack. If k is set to 1, and a theoretical error of the reference charge capacity estimated based on $C_{RC}1$ is within 20%, an error, when k is set to a range of 0.9 to 1.1, for estimating micro short circuit resistance may be set within the preset error range, and an estimation accuracy rate may be set within an acceptable range, thereby improving applicability of the method for detecting a micro short circuit of a battery provided in this embodiment of the present invention.

Similarly, when calculating $C_{RC}2$, the terminal may calculate an integral of the charging current (namely, the charging current of the to-be-detected single battery), during charging, of the battery pack in $\Delta t_1$ to obtain an integral value (which is set as a second integral value) of the charging current in $\Delta t_1$. An expression is as follows:

$$C_{RC}2 = k \int_{t}^{t+\Delta t_1} I$$

where $C_{RC}2$ is a reference charge capacity of a current I in $\Delta t_1$, and k is the preset battery capacity ratio. When k is equal to 1, $$C_{RC}2 = \int_{t}^{t+\Delta t_1} I$$

When k is not equal to 1, $C_{RC}2$ may be considered as a reference charge capacity obtained by scaling up/down the integral of the charging current I in $\Delta t_1$ based on k.

Operation S202: Determine, based on a difference between the first reference charge capacity and the second reference charge capacity, that a micro short circuit occurs in the to-be-detected single battery.

In one embodiment, after obtaining $C_{RC}1$ and $C_{RC}2$, the terminal may analyze, based on $C_{RC}1$ and $C_{RC}2$, a micro short circuit status of a battery. Specifically, the terminal may determine, based on a difference between $C_{RC}1$ and $C_{RC}2$, whether a micro short circuit occurs in the battery. The difference between $C_{RC}1$ and $C_{RC}2$ includes a direct difference between $C_{RC}1$ and $C_{RC}2$, for example, ($C_{RC}2-C_{RC}1$). The difference between $C_{RC}1$ and $C_{RC}2$ also includes a difference of another quantity calculated based on $C_{RC}$, for example, a difference between two resistance values, obtained based on $C_{RC}1$ and $C_{RC}2$, of a resistor of a single battery. In specific implementation, a specific representation form used for the difference between $C_{RC}1$ and $C_{RC}2$ may be determined according to a requirement of an actual application scenario. No limitation is imposed herein. In this embodiment of the present invention, the direct difference between $C_{RC}2$ and $C_{RC}1$ (for example, ($C_{RC}2-C_{RC}1$)) is used as an example for description, and details are not described again in the following.

It should be noted that, the micro short circuit described in this embodiment of the present invention may include a tiny short circuit that occurs inside a single battery or between positive and negative battery terminals. In one embodiment, a definition of short circuit severity of a tiny short circuit is related to a battery capacity, a battery shape, or the like of a battery, and is also related to a detection requirement of an actual application scenario. The definition of the short circuit severity may be specifically determined according to a requirement of an actual application scenario. No limitation is imposed herein. Calculation of $C_{RC}$ of the single battery used in this embodiment of the present invention is related to a difference of electric quantities between the reference single battery and the to-be-detected single battery at a charging end moment, and a difference between charging electric quantities of single batteries is considered, so that detection on a short circuit status of a battery is more thorough and a detection accuracy rate is higher. Further, in this embodiment of the present invention, a difference of $C_{RC}$ is used, to determine a short circuit status of a battery. Even a tiny sign of a short circuit inside a battery may be detected based on an electric quantity difference between single batteries, so that a micro short circuit status inside a single battery can be monitored starting from a tiny short circuit, thereby improving accuracy in detecting a short circuit inside a battery, decreasing a battery fault misjudgment rate, and preventing risks, such as a thermal runaway, caused by a short circuit inside a single battery as early as possible.

In one embodiment, after obtaining $C_{RC}1$ and $C_{RC}2$, the terminal may calculate a leakage current value of the to-be-detected single battery based on $C_{RC}1$ and $C_{RC}2$. The micro short circuit status of the to-be-detected single battery is more visually and clearly determined by using the leakage current value. Specifically, the terminal may calculate the difference between $C_{RC}2$ and $C_{RC}1$, and calculate a time interval between the second charging end moment and the first charging end moment, namely, a time length between the second charging end moment and the first charging end moment. Further, a ratio of the difference between $C_{RC}2$ and $C_{RC}1$ to the time length between the second charging end moment and the first charging end moment may be determined as the leakage current value of the to-be-detected single battery in the foregoing time interval. As shown in the following expression, the terminal may calculate the leakage current value of each single battery in the time interval between two detections of $C_{RC}$ by using the following expression:

$$I_d = \frac{C_{RC,i+1} - C_{RC,i}}{T_{i+1} - T_i}$$

where $I_d$ is the leakage current value of the to-be-detected single battery, $C_{RC,i}$ is $C_{RC}$ (for example, the foregoing $C_{RC}1$) of the to-be-detected single battery in the $i^{th}$ charging, $C_{RC,i+1}$ is $C_{RC}$ (for example, the foregoing $C_{RC}2$) of the to-be-detected single battery in the $(i+1)^{th}$ charging, $T_i$ (for example, the foregoing first charging end moment) is the charging end moment of the to-be-detected single battery in the $i^{th}$ charging, and $T_{i+1}$ (for example, the foregoing second charging end moment) is the charging end moment of the to-be-detected single battery in the $(i+1)^{th}$ charging. $(T_{i+1}-T_i)$ is a time interval between two calculations of $C_{RC}$, for example, the time interval may be one or more of the foregoing battery charging periods. The time interval may be specifically determined according to a requirement of an actual application scenario. No limitation is imposed herein.

In one embodiment, the terminal may set, based on battery feature parameters such as stability of battery performance of a single battery in a battery pack or voltage detection precision, a preset current threshold of the leakage current value that is used to determine whether a micro short circuit occurs in the to-be-detected single battery. After obtaining the leakage current value of the to-be-detected single battery, the terminal may compare the leakage current value of the to-be-detected single battery with the preset current threshold. If the leakage current value of the to-be-detected single battery is greater than or equal to the preset current threshold, it may be determined that a micro short circuit occurs in the to-be-detected single battery. If the leakage current value of the to-be-detected single battery is less than the preset current threshold, it may be determined that no micro short circuit occurs in the to-be-detected single battery. Specifically, the preset current threshold may be set based on a self-discharge current value of a battery that is in a normal working state. The self-discharge current value of the battery is related to features of the battery, and the preset current threshold may be greater than the self-discharge current value of the battery. In specific implementation, the preset current threshold is related to battery feature parameters, such as stability of battery performance or voltage detection precision. If the stability of battery performance is poor, and the voltage detection precision is low, the preset current threshold may be set to a relatively large value, to prevent misjudgment, caused by factors such as a low voltage detection precision, of a micro short circuit of a battery. In addition, the setting of the preset current threshold may be further related to a balance between a misjudgment rate of a detection algorithm used by a developer for detecting a micro short circuit of a battery and a mainly identified requirement on a micro short circuit degree. If the misjudgment rate of the detection algorithm needs to be low, the preset current threshold may be properly increased; if the micro short circuit status of the to-be-detected single battery needs to be identified starting from a very tiny short circuit of the to-be-detected single battery, this threshold may be properly decreased. The preset current threshold may be specifically determined based on an actual application scenario. No limitation is imposed herein.

In one embodiment, after the terminal obtains the leakage current value of each single battery in the battery pack, if the obtained leakage current value of each single battery has a relatively large exception, the terminal may further correct the leakage current value of each single battery. For example, during charging, if a micro short circuit occurs in a reference single battery (namely, a single battery that is earliest fully charged, or a single battery that has a highest voltage value when power is cut off) in the battery pack, an obtained leakage current value of another single battery may be a negative value. In this case, a leakage current value of a single battery that may generate a negative leakage current needs to be corrected. Referring to FIG. 3, FIG. 3 is another schematic flowchart of a method for detecting a micro short circuit of a battery according to an embodiment of the present invention. A method for correcting a leakage current value provided in this embodiment of the present invention includes the following Operations.

Operation S31: Calculate an average leakage current value of all single batteries in a battery pack.

$$I_{dm} = \frac{1}{n}\sum_{i=1}^{n} I_{d,i}$$

$I_{dm}$ is the average leakage current value of all the single batteries in the battery pack, n is a quantity of single batteries included in the battery pack, and $I_{d,i}$ is a leakage current value of a single battery i.

In one embodiment, a terminal may calculate the average leakage current value (namely, a first average value) of all the single batteries included in the battery pack, and determine, based on the average leakage current value, whether to correct a leakage current value of each single battery that generates a negative leakage current. For example, a first preset current threshold may be set to a value less than or equal to 0, and further, a single battery that has a leakage current value less than 0 may be set as a target single battery, to correct a leakage current value of the target single battery. In one embodiment, during charging, if a micro short circuit occurs in the reference single battery in the battery pack, an electric leakage occurs in the reference single battery in a process of using the battery pack, and an electric quantity of the reference single battery is earliest depleted. When the electric quantity of the reference single battery is depleted, an electric quantity of another single battery may not be depleted. Therefore, in a subsequent charging process, a difference of electric quantities between the another single battery and the reference single battery is becoming smaller. To be specific, in the subsequent charging process of the another single battery, $C_{RC,i}$ is greater than $C_{RC,i+1}$. Therefore, $I_{d,i}$ is less than 0, and in this case, a leakage current value needs to be corrected. If a relatively large quantity of single batteries in the battery pack generate a negative leakage current, that is, the average value of leakage current values of all the single batteries is less than 0 (which is set as a second preset current threshold, and may be specifically a number that approximates 0. This is not limited herein.), it is determined that a micro short circuit occurs in the reference single battery in the battery pack. Therefore, whether the leakage current value needs to be corrected may be determined based on the average value of the leakage current values of all the single batteries. In one embodiment, the first preset current threshold and the second preset current threshold may be set to a same threshold (for example, 0), or may be set to different thresholds. The thresholds may be specifically determined according to a requirement of an actual application scenario. No limitation is imposed herein.

Operation S32: Determine whether $I_{dm}$ is negative; and if $I_{dm}$ is negative, perform step S33; if $I_{dm}$ is not negative, perform operation S35.

In one embodiment, the terminal may set the second preset current threshold to 0. When the first average value is less than 0, that is, $I_{dm}$ is negative, it may be determined that the leakage current value of the target single battery in the battery pack needs to be corrected.

Operation S33: Calculate an average leakage current value of all single batteries that have a negative leakage current value.

$$I_s = \frac{1}{m}\sum_{i=1}^{m} I_{d,i} \quad I_{d,j} < 0$$

where $I_s$ is the average leakage current value (which is set as the second average value) of all the single batteries that have a negative leakage current value in the battery pack, m is a quantity of the single batteries that have a negative leakage current value included in the battery pack, m is less than n, and $I_{d,i}$ is a leakage current value of a single battery i.

Operation S34: Correct a leakage current value of each single battery that has a negative leakage current value to obtain a corrected leakage current value of the single battery.

$$I_{ds,i} = I_{d,i} - I_s$$

where $I_{ds,i}$ is a corrected leakage current value of the single battery i.

In one embodiment, during correcting a leakage current value of a target single battery that generates a negative leakage current value, the terminal may subtract $I_s$ from the leakage current value of the target single battery, to obtain a corrected leakage current value.

Operation S35: Set a leakage current value that is less than or very close to 0 to 0.

$$I_{ds,i} = 0 \text{ if} (I_{ds,i} < \varepsilon),$$

where ε is a value that is close 0.

In one embodiment, if the corrected leakage current value $I_{ds,i}$ is still less than or close to 0, it indicates that $I_{d,i}$ is less than $I_s$. In this case, it may be determined that a difference of $C_{RC}$ between two times of charging of the single battery i is relatively small. Therefore, it may be determined that an electric leakage does not occur in the single battery i, that is, a micro short circuit does not occur in the single battery i. In this embodiment of the present invention, the leakage current value of the single battery may be set to 0 when it is determined that a micro short circuit does not occur in the single battery, and that $I_{ds,i}$ is 0 is used to identify a single battery in which no short circuit occurs.

Further, in one embodiment, after obtaining a leakage current value of a to-be-detected single battery, the terminal may further calculate micro short circuit resistance of the to-be-detected single battery. A micro short circuit status of the to-be-detected single battery is more visually and clearly determined by using the micro short circuit resistance, and resistance and the like of a micro short circuit of the to-be-detected single battery can be quantitatively detected through calculation of the micro short circuit resistance. After determining the leakage current value of the to-be-detected single battery, the terminal may calculate the micro short circuit resistance of the to-be-detected single battery based on the average voltage of the single battery in the battery pack. The leakage current value of the to-be-detected single battery includes the corrected leakage current value. In one embodiment, the terminal may calculate the leakage current value based on the voltage value, recorded by the BMS, of each single battery in the battery pack at each voltage sampling moment in a time length between a second charging end moment and a first charging end moment. Specifically, in a charging/discharging process of the battery pack, the BMS may collect the voltage value of each single battery in the battery pack based on a preset voltage sampling period. The preset voltage sampling period may be an existing voltage collection period of the BMS. No limitation is imposed herein. The terminal may obtain, from the voltage value of each single battery recorded by the BMS, the voltage value of the single batteries in the to-be-detected battery pack at each voltage sampling moment, and may further calculate an average value of voltage values of each single battery. If the to-be-detected battery pack is in an online state in the time length between the second charging end moment and the first charging end moment, N voltage sampling moments included in the time length between the second charging end moment and the first charging end moment may be determined based on the preset voltage sampling period. A first voltage sampling moment of the N voltage sampling moments is a voltage sampling moment that is closest to the first charging end moment, namely, the first collection moment in the time length when the BMS collects voltage values of the single batteries based on the existing voltage collection period. Then the BMS continuously collects the voltage value of each single battery at another voltage sampling moment in the time length based on the voltage collection period. A last voltage sampling moment is a voltage sampling moment that is closest to the second charging end moment. A time length between two adjacent voltage sampling moments of the N voltage sampling moments is equal to the voltage sampling period of the BMS, namely, the foregoing preset voltage sampling period.

It should be noted that, if a fault occurs in the to-be-detected battery pack between the second charging end moment and the second charging end moment, for example, an external power supply device of the to-be-detected battery pack is faulty and stops supplying power to the to-be-detected battery pack, and consequently, a fault such as power-off occurs in the to-be-detected battery pack. In this case, the N voltage sampling moments are collection moments at which the BMS collects voltage values of the single batteries when the to-be-detected battery pack is in a normal working state. In a time segment in which the to-be-detected battery pack is in a working interrupted state, the BMS does not collect the voltage values of the single batteries. For example, after the BMS collects a voltage value of each single battery at the voltage collection moment that is closest to the first charging end moment, the to-be-detected battery pack is faulty. In this case, the BMS cannot collect or record the voltage values of the single batteries in the battery pack. After the to-be-detected battery pack restores to a normal working state, the BMS may continue to collect and record the voltage values of the single batteries in the battery pack. In this application scenario, the N voltage sampling moments (assumed to be N1) between the second charging end moment and the first charging end moment are less than the N voltage sampling moments (assumed to be N2) between the second charging end moment and the first charging end moment in the foregoing application scenario in which the to-be-detected battery pack is in the online state in the time length between the second charging end moment and the second charging end moment. In other words, N1 is less than N2.

In one embodiment, the terminal may sequentially calculate a first average voltage value, which is set as U(kT), of each single battery in the to-be-detected battery pack at a $K^{th}$ voltage sampling moment in every two adjacent voltage sampling moments of the N voltage sampling moments, and a second average voltage value, which is set as $U_M((k-1)T)$, of each single battery in the to-be-detected battery pack at a $(K-1)^{th}$ voltage sampling moment. For example, when K is equal to 2, the terminal may calculate an average value of voltage values of each single battery in the to-be-detected battery pack at a first voltage sampling moment, and an average value of voltage values of each single battery in the to-be-detected battery pack at a second voltage sampling moment. Further, the terminal scales up/down the first average voltage value and the second average voltage value based on a preset filtering coefficient, and adds up a scaled value of the first average voltage value and a scaled value of the voltage value of the to-be-detected battery pack to obtain an average voltage value (set as $U_M(kT)$) at the $K^{th}$ voltage sampling moment. As shown in the following expression, the terminal may calculate the average voltage value of the battery pack at the $K^{th}$ voltage sampling moment:

$$U_M(kT) = \alpha \cdot U(kT) + (1-\alpha) \cdot U_M((k-1)T)$$

where $U_M(kT)$ is an approximate average voltage value of the single batteries in the battery pack at this moment, $U_M((k-1)T)$ is an approximate average voltage value of the single batteries in the battery pack at a previous moment, and $U(kT)$ is an average voltage value of the voltage values of each single battery collected at this moment, $\alpha$ is a filtering coefficient, and may be set to 0.0001 herein.

When K is equal to 3, the terminal may calculate the average voltage value (which may be specifically the approximate voltage value of the single batteries in the battery pack at the previous moment) of the voltage values of each single battery in the to-be-detected battery pack at the second voltage sampling moment, and an average voltage value (which may be specifically the average voltage value of the voltage values of each single battery collected at this moment) of the voltage values of each single battery in the to-be-detected battery pack at a third voltage sampling moment. Further, the average voltage value (namely, the approximate average value of the voltage values of the single batteries in the battery pack at this moment) of the single batteries in the battery pack when K is equal to 3 may be calculated based on the expression of $U_M(kT)$. By analogy, average voltage values at all voltage collection moments are sequentially calculated. When K is equal to N, the average voltage value at the $K^{th}$ voltage sampling moment may be determined as an average voltage value in the time length between the second charging end moment and the first charging end moment. The following uses $U_M$ for description.

Further, it may be determined, based on the leakage current value of the single battery, that the micro short circuit resistance of the single battery may be $R_{ISC}$:

$$R_{ISC} = \begin{cases} \dfrac{U_M}{I_{ds,i}} & I_{ds,i} > 0 \\ \text{Inf} & I_{ds,i} = 0 \end{cases}$$

where $R_{ISC}$ is micro short circuit resistance of a single battery i, $I_{ds}$ is a leakage current of the single battery i, and Inf indicates that no short circuit occurs. A micro short circuit status of the single battery can be quantitatively determined through calculation of the micro short circuit resistance of the single battery, so that a detection accuracy rate is higher, and applicability is higher.

In this embodiment of the present invention, the reference charge capacity of each single battery in the to-be-detected battery pack is estimated based on data collected by the BMS, and a micro short circuit current value (namely, a leakage current value) of each single battery is determined based on estimation of a change of the reference charge capacity of the single battery. No additional sensor is needed when the leakage current is detected by using data collected by the BMS, and an amount of data that needs to be stored and a data calculation amount are relatively small, so that difficulty in detecting a micro short circuit of a battery is decreased, and applicability is high. Further, in this embodiment of the present invention, the micro short circuit resistance of each single battery can be estimated based on the leakage current value of the single battery, a micro short circuit status of each single battery in the battery pack can be detected before a severe micro short circuit occurs in the battery pack, a tiny short circuit can be detected in advance, and a quantitative result can be provided. This can improve accuracy in detecting a micro short circuit and decrease a battery fault misjudgment rate. Therefore, an objective of prevention is achieved, and operation safety of the battery pack is ensured.

Figure 4:
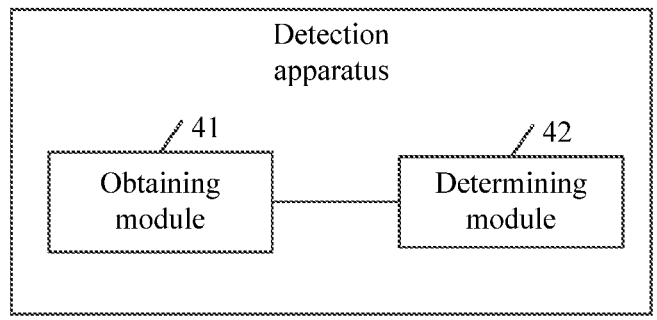
FIG. 4 is a schematic structural diagram of an apparatus for detecting a micro short circuit of a battery according to an embodiment of the present invention.

Referring to FIG. 4, FIG. 4 is a schematic structural diagram of an apparatus for detecting a micro short circuit of a battery according to an embodiment of the present invention. The detection apparatus provided in this embodiment of the present invention includes:

an obtaining module 41, configured to obtain a first reference charge capacity at a first charging end moment and a second reference charge capacity at a second charging end moment of a to-be-detected single battery included in a to-be-detected battery pack, where the reference charge capacity is a difference between an electric quantity of the to-be-detected single battery and an electric quantity of a reference single battery, and the reference single battery is a single battery, which has a largest voltage value at a charging end moment, in all single batteries included in the to-be-detected battery pack; and a determining module 42, configured to determine, based on a difference that is obtained by the obtaining module 41 and that is between the first reference charge capacity and the second reference charge capacity, that a micro short circuit occurs in the to-be-detected single battery.

In one embodiment, the determining module 42 is configured to:

use the obtaining module 41 to: calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery; and if the leakage current value is greater than or equal to a preset current threshold, determine that a micro short circuit occurs in the to-be-detected single battery.

In some feasible implementations, the determining module 42 is specifically configured to:

use the obtaining module 41 to: calculate the difference between the second reference charge capacity and the first reference charge capacity, and calculate a time length between the second charging end moment and the first charging end moment;

determine a ratio of the difference between the second reference charge capacity and the first reference charge capacity to the time length as a leakage current value of the to-be-detected single battery;

use the obtaining module 41 to: calculate an average voltage value, over the time length, of each single battery in the to-be-detected battery pack, and determine micro short circuit resistance of the to-be-detected single battery based on the leakage current value; and if the micro short circuit resistance is less than a preset resistance threshold, determine that a micro short circuit occurs in the to-be-detected single battery.

In one embodiment, the determining module 42 is further configured to:

determine a first remaining charging time of the to-be-detected single battery at the first charging end moment and a second remaining charging time of the to-be-detected single battery at the second charging end moment.

The obtaining module 41 is configured to:

calculate, based on a charging current of the to-be-detected single battery, the first reference charge capacity corresponding to the first remaining charging time determined by the determining module 42 and the second reference charge capacity corresponding to the second remaining charging time determined by the determining module 42, where the first remaining charging time is required charging duration corresponding to a voltage difference between the to-be-detected single battery and the reference single battery at the first charging end moment; and the second remaining charging time is required charging duration corresponding to a voltage difference between the to-be-detected single battery and the reference single battery at the second charging end moment.

In one embodiment, the determining module 42 is specifically configured to:

obtain a voltage value of each single battery in the to-be-detected battery pack at the first charging end moment, and determine a first reference single battery in the to-be-detected battery pack; search, on a first charging voltage curve of the first reference single battery, for a first moment corresponding to a first voltage value, where the first voltage value is a voltage value of the to-be-detected single battery at the first charging end moment; and use a time difference $\Delta t_0$ between the first moment and the first charging end moment as the first remaining charging time; and obtain a voltage value of each single battery in the to-be-detected battery pack at the second charging end moment, and determine a second reference single battery in the to-be-detected battery pack; search, on a second charging voltage curve of the second reference single battery, for a second moment corresponding to a second voltage value, where the second voltage value is a voltage value of the to-be-detected single battery at the second charging end moment; and use a time difference $\Delta t_1$ between the second moment and the second charging end moment as the second remaining charging time.

In one embodiment, the obtaining module 41 is configured to:

calculate an integral of the charging current of the to-be-detected single battery in $\Delta t_0$ to obtain a first integral value, and scale up/down the first integral value based on a preset battery capacity ratio to obtain a first reference charge capacity; and calculate an integral of the charging current of the to-be-detected single battery in $\Delta t_1$ to obtain a second integral value, and scale up/down the second integral value based on the preset battery capacity ratio to obtain the second reference charge capacity.

Figure 5:
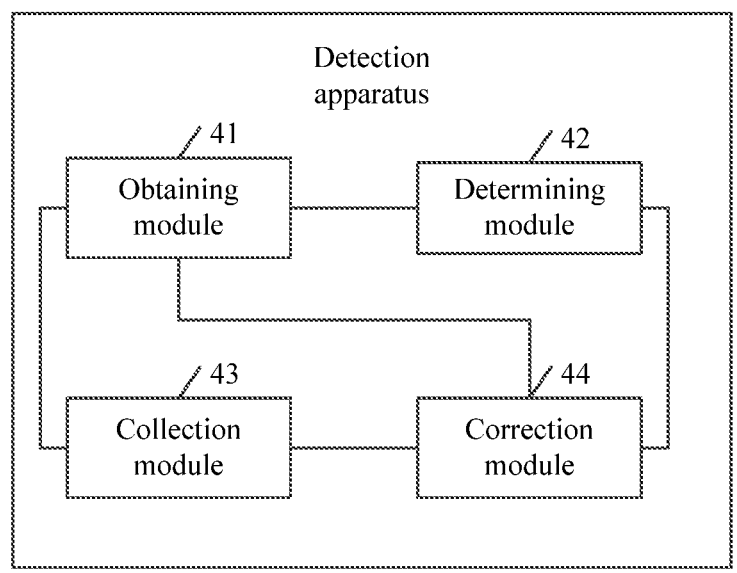
FIG. 5 is another schematic structural diagram of an apparatus for detecting a micro short circuit of a battery according to an embodiment of the present invention.

In one embodiment, referring to FIG. 5, FIG. 5 is another schematic structural diagram of an apparatus for detecting a micro short circuit of a battery according to an embodiment of the present invention. The detection apparatus provided in this embodiment of the present invention further includes:

a collection module 43, configured to collect a voltage value of each single battery in the to-be-detected battery pack at each of N voltage sampling moments between the second charging end moment and the first charging end moment, where duration between two adjacent voltage sampling moments of the N voltage sampling moments is less than or equal to a preset voltage sampling period, and N is an integer greater than or equal to 2.

The obtaining module 41 is configured to:

sequentially calculate a first average voltage value of a voltage value, collected by the collection module 43, of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment;

scale up/down the first average voltage value and the second average voltage value based on a preset filtering coefficient, and add up a scaled value of the first average voltage value and a scaled value of the second average voltage value to obtain an average voltage value at the $K^{th}$ voltage sampling moment; and when K is equal to N, determine the average voltage value at the $K^{th}$ voltage sampling moment as the average voltage value over the time length.

In one embodiment, the to-be-detected single battery is any one of at least one single battery in the to-be-detected battery pack.

The obtaining module 41 is further configured to:

calculate a leakage current value of another single battery included in the to-be-detected battery pack, and calculate a first average value of a leakage current value of all of the at least one single battery.

The determining module 42 is further configured to:

determine, based on the first average value calculated by the obtaining module 41, that a leakage current value of a target single battery of the at least one single battery needs to be corrected, where the leakage current value of the target single battery is less than a first preset current threshold.

In one embodiment, as shown in FIG. 5, the detection apparatus further includes:

a correction module 44, configured to: when the first average value calculated by the obtaining module 41 is less than a second preset current threshold, obtain a leakage current value of the at least one target single battery of at least one single battery; and use the obtaining module to: calculate a second average value of the leakage current value of the at least one target single battery, and adjust a leakage current value of each target single battery based on the second average value to obtain a corrected leakage current value of each target single battery.

The time length between the second charging end moment and the first charging end moment includes at least one consecutive or non-consecutive battery charging period, where the battery charging period is duration between two adjacent charging end moments of the to-be-detected battery pack.

In one embodiment, the apparatus for detecting a micro short circuit of a battery may be specifically a terminal device provided in this embodiment of the present invention, and may perform, by using modules built in the apparatus, implementations described in the steps of the method for detecting a micro short circuit of a battery. For a specific implementation process, refer to the implementations described in the foregoing steps. Details are not described herein again.

In this embodiment of the present invention, the terminal may estimate a reference charge capacity of each single battery in the to-be-detected battery pack by using data collected by a BMS, and determine a micro short circuit current value (namely, a leakage current value) of each single battery based on estimation of a change of the reference charge capacity of the single battery. No additional sensor is needed when the leakage current is detected by using data collected by the BMS, and an amount of data that needs to be stored and a data calculation amount are relatively small, so that difficulty in detecting a micro short circuit of a battery is decreased, and applicability is high. Further, the terminal may estimate micro short circuit resistance of each single battery based on the leakage current value of each single battery, detect a micro short circuit status of each single battery in the battery pack before a severe micro short circuit occurs in the battery pack, detect a tiny short circuit in advance, and provide a quantitative result. This can improve accuracy in detecting a micro short circuit, and decrease a battery fault misjudgment rate. Therefore, an objective of prevention is achieved, and operation safety of the battery pack is ensured.

In the specification, claims, and accompanying drawings of the present invention, the terms "first", "second", "third", "fourth", and so on are intended to distinguish between different objects but do not indicate a particular order. In addition, the terms "including", "having", or any other variant thereof, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the system, the product, or the device.

A person of ordinary skill in the art may understand that all or some of the processes of the methods in the embodiments may be implemented by a computer program instructing relevant hardware. The program may be stored in a computer readable storage medium. When the program runs, the processes of the methods in the embodiments are performed. The foregoing storage medium may include: a magnetic disk, an optical disc, a read-only memory (Read-Only Memory, ROM), or a random access memory (Random Access Memory, RAM).

What is disclosed above is merely example embodiments of the present invention, and certainly is not intended to limit the protection scope of the present invention. Therefore, equivalent variations made in accordance with the claims of the present invention shall fall within the scope of the present invention.

What is claimed is:

1. A method performed by a terminal device for detecting a micro short circuit of a battery, wherein the terminal device comprises at least one processor and a memory, the method comprising:

obtaining, by the at least one processor, a first reference charge capacity at a first charging end moment and a second reference charge capacity at a second charging end moment of a to-be-detected single battery comprised in a to-be-detected battery pack, wherein the first reference charge capacity is a difference between an electric quantity of the to-be-detected single battery and an electric quantity of a reference single battery at the first charging end moment, the second reference charge capacity is a difference between an electric quantity of the to-be-detected single battery and an electric quantity of a reference single battery at the second charging end moment; and the reference single battery is a single battery, which has a largest voltage value at a charging end moment, in all single batteries comprised in the to-be-detected battery pack; and determining, by the at least one processor, based on a difference between the first reference charge capacity and the second reference charge capacity, that a micro short circuit occurs in the to-be-detected single battery.

2. The method according to claim 1, wherein the determining that a micro short circuit occurs in the to-be-detected single battery comprises:

calculating, by the at least one processor, the difference between the second reference charge capacity and the first reference charge capacity, and calculating a time length between the second charging end moment and the first charging end moment;

determining, by the at least one processor, a ratio of the difference between the second reference charge capacity and the first reference charge capacity to the time length as a leakage current value of the to-be-detected single battery; and if the leakage current value is greater than or equal to a preset current threshold, determining, by the at least one processor, that the micro short circuit occurs in the to-be-detected single battery.

3. The method according to claim 2, wherein the obtaining a first reference charge capacity at a first charging end moment and a second reference charge capacity at a second charging end moment comprises:

determining, by the at least one processor, a first remaining charging time of the to-be-detected single battery at the first charging end moment and a second remaining charging time of the to-be-detected single battery at the second charging end moment; and calculating, by the at least one processor, based on a charging current of the to-be-detected single battery, the first reference charge capacity corresponding to the first remaining charging time and the second reference charge capacity corresponding to the second remaining charging time, wherein the first remaining charging time is a required charging duration corresponding to a first voltage difference between the to-be-detected single battery and the reference single battery at the first charging end moment; and the second remaining charging time is a required charging duration corresponding to a second voltage difference between the to-be-detected single battery and the reference single battery at the second charging end moment.

4. The method according to claim 3, wherein the determining a first remaining charging time of the to-be-detected single battery at the first charging end moment and a second remaining charging time of the to-be-detected single battery at the second charging end moment comprises:

determining, by the at least one processor, a first reference single battery in the to-be-detected battery pack based on a voltage value of each single battery in the to-be-detected battery pack obtained at the first charging end moment;

searching, by the at least one processor, on a first charging voltage curve of the first reference single battery, for a first moment corresponding to a first voltage value of the to-be-detected single battery at the first charging end moment, using a time difference $\Delta t_0$ between the first moment and the first charging end moment as the first remaining charging time;

determining, by the at least one processor, a second reference single battery in the to-be-detected battery pack based on a voltage value of each single battery in the to-be-detected battery pack obtained at the second charging end moment; and searching, by the at least one processor, on a second charging voltage curve of the second reference single battery, for a second moment corresponding to a second voltage value of the to-be-detected single battery at the second charging end moment, using a time difference $\Delta t_1$ between the second moment and the second charging end moment as the second remaining charging time.

5. The method according to claim 4, wherein the calculating the first reference charge capacity corresponding to the first remaining charging time and the second reference charge capacity corresponding to the second remaining charging time comprises:

calculating, by the at least one processor, a first integral of the charging current of the to-be-detected single battery in $\Delta t_0$ to obtain a first integral value, and scaling up/down the first integral value based on a preset battery capacity ratio to obtain the first reference charge capacity; and calculating, by the at least one processor, a second integral of the charging current of the to-be-detected single battery in $\Delta t_1$ to obtain a second integral value, and scaling up/down the second integral value based on the preset battery capacity ratio to obtain the second reference charge capacity.

6. The method according to claim 5, wherein the time length between the second charging end moment and the first charging end moment comprises at least one consecutive or non-consecutive battery charging period, wherein the battery charging period is duration between two adjacent charging end moments of the to-be-detected battery pack.

7. The method according to claim 2, wherein the to-be-detected single battery is any one of at least one single battery in the to-be-detected battery pack; and wherein the method further comprises:

calculating, by the at least one processor, a leakage current value of another single battery comprised in the to-be-detected battery pack, and calculating a first average value of a leakage current value of all of the at least one single battery; and determining, by the at least one processor, based on the first average value, that a leakage current value of a target single battery of the at least one single battery needs to be corrected in response to determining that the leakage current value of the target single battery is less than a first preset current threshold.

8. The method according to claim 7, further comprises:

if the first average value is less than a second preset current threshold, obtaining a leakage current value of at least one target single battery of the at least one single battery; and calculating, by the at least one processor, a second average value of the leakage current value of the at least one target single battery, and adjusting a leakage current value of each target single battery based on the second average value to obtain a corrected leakage current value of each target single battery.

9. The method according to claim 1, wherein the determining that a micro short circuit occurs in the to-be-detected single battery comprises:

calculating, by the at least one processor, the difference between the second reference charge capacity and the first reference charge capacity, and calculating a time length between the second charging end moment and the first charging end moment;

determining, by the at least one processor, a ratio of the difference between the second reference charge capacity and the first reference charge capacity to the time length as a leakage current value of the to-be-detected single battery;

calculating, by the at least one processor, an average voltage value, over the time length, of each single battery in the to-be-detected battery pack, and determining a micro short circuit resistance of the to-be-detected single battery based on the leakage current value; and if the micro short circuit resistance is less than a preset resistance threshold, determining, by the at least one processor, that the micro short circuit occurs in the to-be-detected single battery.

10. The method according to claim 9, wherein the calculating an average voltage value, over the time length, of each single battery in the to-be-detected battery pack comprises:

collecting, by the at least one processor, a voltage value of each single battery in the to-be-detected battery pack at each of N voltage sampling moments between the second charging end moment and the first charging end moment, wherein a duration between two adjacent voltage sampling moments of the N voltage sampling moments is less than or equal to a preset voltage sampling period, and N is an integer greater than or equal to 2;

sequentially calculating, by the at least one processor, a first average voltage value of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment;

scaling up/down, by the at least one processor, the first average voltage value and the second average voltage value based on a preset filtering coefficient, and adding up a first scaled value of the first average voltage value and a second scaled value of the second average voltage value to obtain an average voltage value at the $K^{th}$ voltage sampling moment; and when K is equal to N, determining, by the at least one processor, the average voltage value at the $K^{th}$ voltage sampling moment as the average voltage value over the time length.

11. A terminal device for detecting a micro short circuit of a battery, comprising:

at least one processor; and a memory coupled to the at least one processor and storing programming instructions for execution by the at least one processor, the programming instructions instruct the at least one processor to perform the following operations:

obtaining a first reference charge capacity at a first charging end moment and a second reference charge capacity at a second charging end moment of a to-be-detected single battery comprised in a to-be-detected battery pack, wherein the first reference charge capacity is a difference between an electric quantity of the to-be-detected single battery and an electric quantity of a reference single battery at the first charging end moment, the second reference charge capacity is a difference between an electric quantity of the to-be-detected single battery and an electric quantity of a reference single battery at the second charging end moment; and the reference single battery is a single battery, which has a largest voltage value at a charging end moment, in all single batteries comprised in the to-be-detected battery pack; and determining, based on a difference between the first reference charge capacity and the second reference charge capacity, that a micro short circuit occurs in the to-be-detected single battery.

12. The terminal device according to claim 11, wherein the programming instructions instruct the at least one processor to perform the following operations:

calculating the difference between the second reference charge capacity and the first reference charge capacity, and calculating a time length between the second charging end moment and the first charging end moment;

determining a ratio of the difference between the second reference charge capacity and the first reference charge capacity to the time length as a leakage current value of the to-be-detected single battery; and if the leakage current value is greater than or equal to a preset current threshold, determining that the micro short circuit occurs in the to-be-detected single battery.

13. The terminal device according to claim 12, wherein the programming instructions instruct the at least one processor to perform the following operations:

determining a first remaining charging time of the to-be-detected single battery at the first charging end moment and a second remaining charging time of the to-be-detected single battery at the second charging end moment;

calculating, based on a charging current of the to-be-detected single battery, the first reference charge capacity corresponding to the first remaining charging time and the second reference charge capacity corresponding to the second remaining charging time, wherein the first remaining charging time is a required charging duration corresponding to a voltage difference between the to-be-detected single battery and the reference single battery at the first charging end moment; and the second remaining charging time is a required charging duration corresponding to a voltage difference between the to-be-detected single battery and the reference single battery at the second charging end moment.

14. The terminal device according to claim 13, wherein the programming instructions instruct the at least one processor to perform the following operations:

determining a first reference single battery in the to-be-detected battery pack based on a voltage value of each single battery in the to-be-detected battery pack obtained at the first charging end moment;

searching, on a first charging voltage curve of the first reference single battery, for a first moment corresponding to a first voltage value, wherein the first voltage value is a voltage value of the to-be-detected single battery at the first charging end moment; and use a time difference $\Delta t_0$ between the first moment and the first charging end moment as the first remaining charging time;

determining a second reference single battery in the to-be-detected battery pack based on a voltage value of each single battery in the to-be-detected battery pack obtained at the second charging end moment; and searching, on a second charging voltage curve of the second reference single battery, for a second moment corresponding to a second voltage value, wherein the second voltage value is a voltage value of the to-be-detected single battery at the second charging end moment; and use a time difference $\Delta t_1$ between the second moment and the second charging end moment as the second remaining charging time.

15. The terminal device according to claim 14, wherein the programming instructions instruct the at least one processor to perform the following operations:

calculating a first integral of the charging current of the to-be-detected single battery in $\Delta t_0$ to obtain a first integral value, and scale up/down the first integral value based on a preset battery capacity ratio to obtain the first reference charge capacity; and calculating a second integral of the charging current of the to-be-detected single battery in $\Delta t_1$ to obtain a second integral value, and scale up/down the second integral value based on the preset battery capacity ratio to obtain the second reference charge capacity.

16. The terminal device according to claim 15, wherein the time length between the second charging end moment and the first charging end moment comprises at least one consecutive or non-consecutive battery charging period, wherein the battery charging period is duration between two adjacent charging end moments of the to-be-detected battery pack.

17. The terminal device according to claim 12, wherein the to-be-detected single battery is any one of at least one single battery in the to-be-detected battery pack;

the programming instructions instruct the at least one processor to perform the following operations:

calculating a leakage current value of another single battery comprised in the to-be-detected battery pack, and calculate a first average value of a leakage current value of all of the at least one single battery;

determining, based on the first average value, that a leakage current value of a target single battery of the at least one single battery needs to be corrected, in response to determining that the leakage current value of the target single battery is less than a first preset current threshold.

18. The terminal device according to claim 17, wherein the programming instructions instruct the at least one processor to perform the following operations:

when the first average value is less than a second preset current threshold, obtaining a leakage current value of at least one target single battery of the at least one single battery; calculating a second average value of the leakage current value of the at least one target single battery, and adjusting a leakage current value of each target single battery based on the second average value to obtain a corrected leakage current value of each target single battery.

19. The terminal device according to claim 11, wherein the programming instructions instruct the at least one processor to perform the following operations:

calculating the difference between the second reference charge capacity and the first reference charge capacity, calculating a time length between the second charging end moment and the first charging end moment;

determining a ratio of the difference between the second reference charge capacity and the first reference charge capacity to the time length as a leakage current value of the to-be-detected single battery;

calculating an average voltage value, over the time length, of each single battery in the to-be-detected battery pack, and determining micro short circuit resistance of the to-be-detected single battery based on the leakage current value; and if the micro short circuit resistance is less than a preset resistance threshold, determining that a micro short circuit occurs in the to-be-detected single battery.

20. The terminal device according to claim 19, wherein the programming instructions instruct the at least one processor to perform the following operations:

collecting a voltage value of each single battery in the to-be-detected battery pack at each of N voltage sampling moments between the second charging end moment and the first charging end moment, wherein a duration between two adjacent voltage sampling moments of the N voltage sampling moments is less than or equal to a preset voltage sampling period, and N is an integer greater than or equal to 2;

sequentially calculating a first average voltage value of a voltage value, collecting of each single battery in the to-be-detected battery pack at a $K^{th}$ voltage sampling moment in every two adjacent voltage sampling moments, and a second average voltage value of each single battery in the to-be-detected battery pack at a $(K-1)^{th}$ voltage sampling moment;

scaling up/down the first average voltage value and the second average voltage value based on a preset filtering coefficient, and add up a first scaled value of the first average voltage value and a second scaled value of the second average voltage value to obtain an average voltage value at the $K^{th}$ voltage sampling moment; and when K is equal to N, determining the average voltage value at the $K^{th}$ voltage sampling moment as the average voltage value over the time length.

* * * * *